United States Patent
Saha

(10) Patent No.: US 8,035,384 B2
(45) Date of Patent: Oct. 11, 2011

(54) HYBRID BIRDCAGE-TEM RADIO FREQUENCY (RF) COIL FOR MULTINUCLEAR MRI/MRS

(75) Inventor: Saikat Saha, Florence, SC (US)

(73) Assignee: General Electric Company, Schenectady, NY (US)

( * ) Notice: Subject to any disclaimer, the term of this patent is extended or adjusted under 35 U.S.C. 154(b) by 263 days.

(21) Appl. No.: 12/256,725

(22) Filed: Oct. 23, 2008

(65) Prior Publication Data

US 2010/0102817 A1    Apr. 29, 2010

(51) Int. Cl.
*G01V 3/00* (2006.01)

(52) U.S. Cl. .......................................... 324/318

(58) Field of Classification Search .......... 324/300–322; 600/410–435; 333/219–235
See application file for complete search history.

(56) References Cited

U.S. PATENT DOCUMENTS

| | | | |
|---|---|---|---|
| 4,742,304 A | 5/1988 | Schnall et al. | |
| 4,799,016 A | 1/1989 | Rezvani | |
| 5,041,790 A | 8/1991 | Tropp et al. | |
| 5,168,230 A | 12/1992 | Hashoian et al. | |
| 5,559,434 A * | 9/1996 | Takahashi et al. | 324/318 |
| 5,572,128 A | 11/1996 | Kess | |
| 5,680,047 A | 10/1997 | Srinivasan et al. | |
| 5,682,893 A * | 11/1997 | Meyer et al. | 600/421 |
| 5,998,999 A * | 12/1999 | Richard et al. | 324/318 |
| 6,081,120 A | 6/2000 | Shen | |
| 6,466,018 B1 * | 10/2002 | Dumoulin et al. | 324/318 |
| 6,992,486 B2 * | 1/2006 | Srinivasan | 324/318 |
| 7,081,753 B2 | 7/2006 | Mullen et al. | |
| 7,084,630 B2 | 8/2006 | Ludwig et al. | |
| 7,123,012 B2 | 10/2006 | Srinivasan | |
| 7,180,291 B2 * | 2/2007 | Chmielewski et al. | 324/318 |
| 7,292,038 B2 * | 11/2007 | Doty | 324/318 |
| 7,345,481 B2 | 3/2008 | Leussler | |
| 7,501,823 B2 * | 3/2009 | Nistler et al. | 324/318 |
| 7,733,088 B2 * | 6/2010 | Cho et al. | 324/318 |
| 2006/0012370 A1 | 1/2006 | Barberi | |
| 2007/0167725 A1 | 7/2007 | Tropp et al. | |
| 2007/0285096 A1 | 12/2007 | Soutome et al. | |
| 2008/0129292 A1 | 6/2008 | Leussler et al. | |
| 2008/0157770 A1 | 7/2008 | Peshkovsky | |

OTHER PUBLICATIONS

Avdievish et al, High-Field Double-Tuned TEM/Birdcage Hybrid Volume Coil for Human Brain Imaging, Proc. Intl. Soc. Mag. Reson. Med. 15 (2007), p. 239.

Habara et al, The "rung pair" birdcage coil that has the transmission line resonance mode, Proc. Intl. Soc. Mag. Reson. Med. 15 (2007), p. 3274.

Herlihy et al, A Multi-nuclear Body Coil Incorporating a Standard Proton Body Coil, Proc. Intl. Soc. Mag. Reson. Med. 9 (2001), p. 1089.

Gulsen et al, Automatic Tuned MRI RF Coil for Multinuclear Imaging at 3T, Proc. Intl. Soc. Mag. Reson. Med. 9 (2001), p. 1101.

* cited by examiner

*Primary Examiner* — Dixomara Vargas

(57) ABSTRACT

A radio frequency (RF) coil for a magnetic resonance imaging system includes a plurality of rungs disposed around a volume and a first end ring connected to a first end of the plurality of rungs. The first end ring has a first plurality of birdcage mode tuning capacitors and a first plurality of RF traps. The RF coil also includes a second end ring connected to a second end of the plurality of rungs. The second end ring has a second plurality of birdcage mode tuning capacitors and a second plurality of RF traps. An RF shield is disposed around the plurality of rungs, the first end ring and the second end ring. The RF coil also includes a plurality of transverse electromagnetic (TEM) mode tuning capacitors, where each TEM mode tuning capacitor coupled to one of the plurality of rungs. An RF trap is connected to each of the plurality of TEM mode tuning capacitors.

22 Claims, 4 Drawing Sheets

HYBRID BIRDCAGE-TEM RADIO FREQUENCY (RF) COIL FOR MULTINUCLEAR MRI/MRS

FIELD OF THE INVENTION

The present invention relates generally to a magnetic resonance imaging (MRI) system and in particular to a hybrid radio frequency (RF) coil for multinuclear magnetic resonance imaging and spectroscopy.

BACKGROUND OF THE INVENTION

Magnetic resonance imaging (MRI) is a medical imaging modality that can create pictures of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). An MRI system also comprises components called gradient coils that produce smaller amplitude, spatially varying magnetic fields when a current is applied to them. Typically, gradient coils are designed to produce a magnetic field component that is aligned along the z axis, and that varies linearly in amplitude with position along one of the x, y or z axes. The effect of a gradient coil is to create a small ramp on the magnetic field strength, and concomitantly on the resonant frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. The RF coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

MRI systems, including MR spectroscopy systems, can be used to study different nuclei, such as $^1H$, $^{31}P$, $^{13}C$, $^{19}F$, $^2H$, $^{29}Si$, $^{27}Al$ and $^{27}N$ and generate images for more than one nuclei. The different nuclei, however, require different resonant frequencies. Various dual-tuned (or multi-tuned) RF coils have been developed for multi-nuclear imaging and provide a single RF coil capable of resonating simultaneously at more than one frequency. Dual-tuned (or multi-tuned) RF coils reduce imaging time and avoid repositioning artifacts that can be caused from changing the RF coil during a scan. The dual tuned RF coils that have been developed include dual-tuned birdcage coils and dual-tuned transverse electromagnetic (TEM) coils. Birdcage coils and TEM coils each have various advantages depending on the resonant frequencies required.

It would be desirable to provide a hybrid RF coil that can be tuned to multiple frequencies and provides the advantages of both a birdcage coil and a TEM coil in a single RF coil structure.

BRIEF DESCRIPTION OF THE INVENTION

In accordance with an embodiment, a radio frequency (RF) coil for a magnetic resonance imaging system includes a plurality of rungs disposed around a volume, a first end ring connected to a first end of the plurality of rungs and including a first plurality of birdcage mode tuning capacitors and a first plurality of RF traps; a second end ring connected to a second end of the plurality of rungs and including a second plurality of birdcage mode tuning capacitors and a second plurality of RF traps; an RF shield disposed around the plurality of rungs, the first end ring and the second end ring; a plurality of transverse electromagnetic (TEM) mode tuning capacitors, each TEM mode tuning capacitor coupled to one of the plurality of rungs; and a third plurality of RF traps, each RF trap in the third plurality of RF traps coupled to one of the plurality of TEM mode tuning capacitors and the RF shield.

In accordance with another embodiment, a resonance assembly for a magnetic resonance imaging system includes a superconducting magnet, a gradient coil assembly disposed within an inner diameter of the superconducting magnet and a radio frequency (RF) coil disposed within an inner diameter of the gradient coil assembly, the RF coil including a first end ring comprising a first plurality of tuning capacitors tuned to a first resonant frequency, a second end ring comprising a second plurality of tuning capacitors tuned to the first resonant frequency, a plurality of rungs disposed between and connected to the first end ring and the second end ring, a third plurality of tuning capacitors coupled to the plurality of rungs and tuned to a second resonant frequency and an RF shield disposed around the first end ring, the second end ring, the plurality of rungs and the third plurality of tuning capacitors. The RF shield is coupled to the third plurality of tuning capacitors.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION

Figure 1:
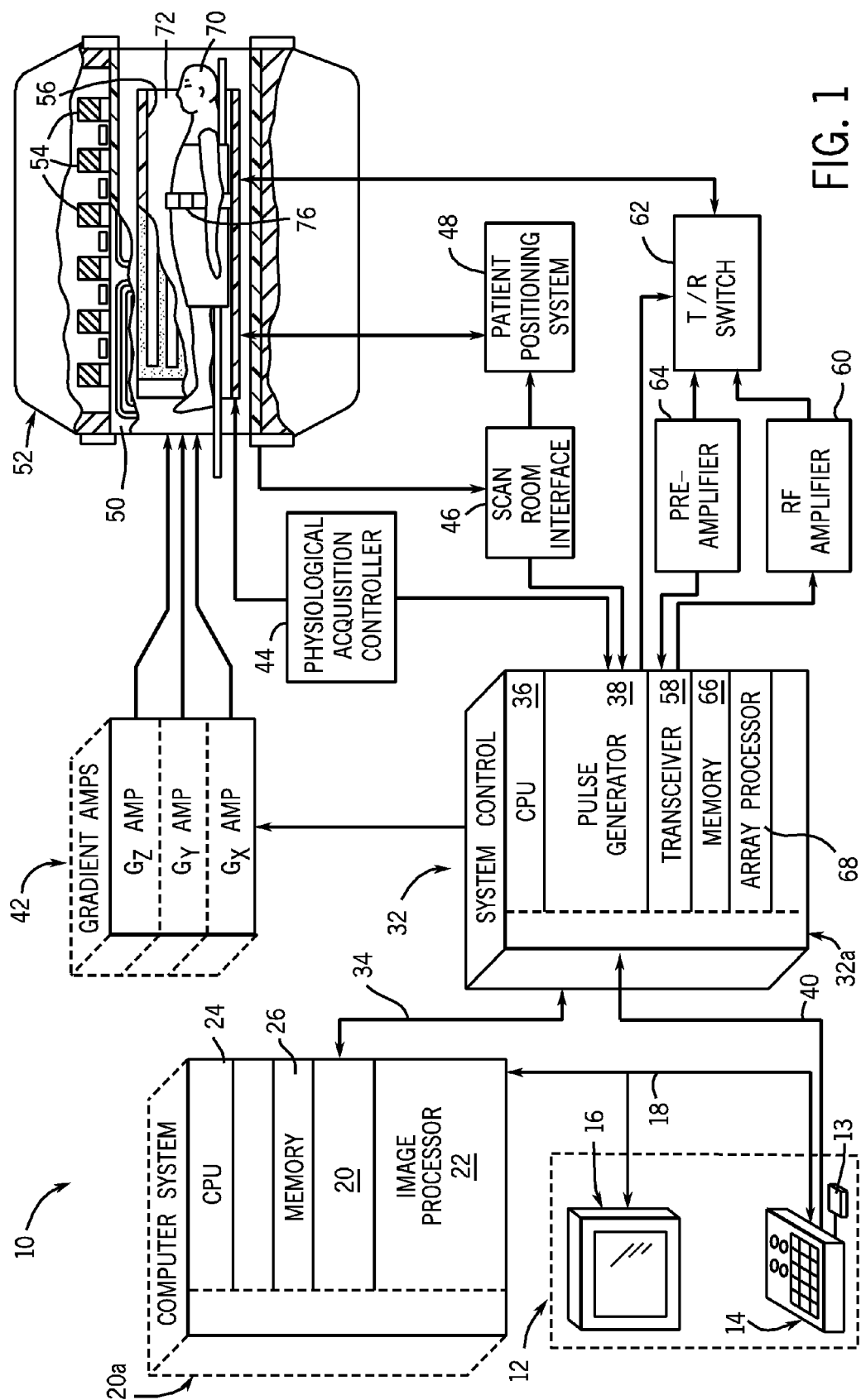
FIG. 1 is a schematic block diagram of an exemplary magnetic resonance imaging (MRI) system in accordance with an embodiment.

FIG. 1 is a schematic block diagram of an exemplary magnetic resonance imaging (MRI) system in accordance with an embodiment. The operation of MRI system 10 is controlled from an operator console 12 that includes a keyboard or other input device 13, a control panel 14, and a display 16. The console 12 communicates through a link 18 with a computer system 20 and provides an interface for an operator to prescribe MRI scans, display resultant images, perform image processing on the images, and archive data and images. The computer system 20 includes a number of modules that communicate with each other through electrical and/or data connections, for example, such as are provided by using a backplane 20a. Data connections may be direct wired links or may be fiber optic connections or wireless communication links or the like. The modules of the computer system 20 include an image processor module 22, a CPU module 24 and a memory module 26 which may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32*a*. Data connections 32*a* may be direct wired links, or may be fiber optic connections or wireless communication links or the like. In alternative embodiments, the modules of computer system 20 and system control computer 32 may be implemented on the same computer system or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., resonance assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests describing the timing, strength and shape of the RF pulses and pulse sequences to be produced and the timing and length of the data acquisition window. The pulse generator module 38 connects to a gradient amplifier system 42 and produces data called gradient waveforms that control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 that is comprised of $G_x$, $G_y$, and $G_z$ amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a resonance assembly 52 that includes a polarizing superconducting magnet with superconducting main coils 54. Resonance assembly 52 may include a whole-body RF coil 56, surface or parallel imaging coils 76 or both. The coils 56, 76 of the RF coil assembly may be configured for both transmitting and receiving or for transmit-only or receive-only. A patient or imaging subject 70 may be positioned within a cylindrical patient imaging volume 72 of the resonance assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel coils or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the RF coil 56 during the receive mode. The transmit/receive switch 62 can also enable a separate RF coil (for example, a parallel or surface coil 76) to be used in either the transmit or receive mode.

The MR signals sensed by the RF coil 56 are digitized by the transceiver module 58 and transferred to a memory module 66 in the system control computer 32. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long-term storage or it may be further processed by the image processor 22 and conveyed to the operator console 12 and presented on display 16.

Figure 2:
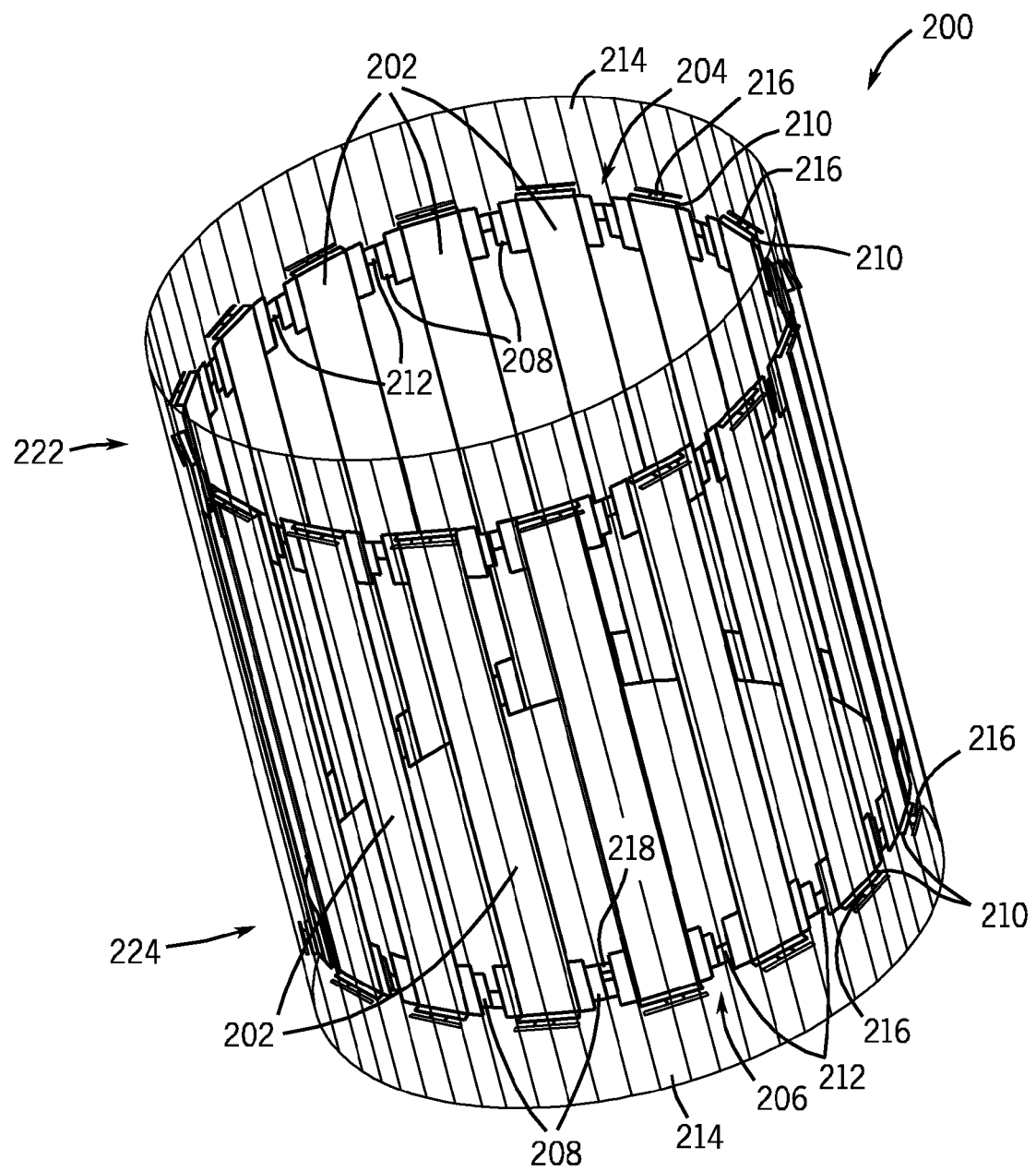
FIG. 2 is a perspective view of a multi-tuned hybrid radio frequency (RF) coil in accordance with an embodiment.
Figure 3:
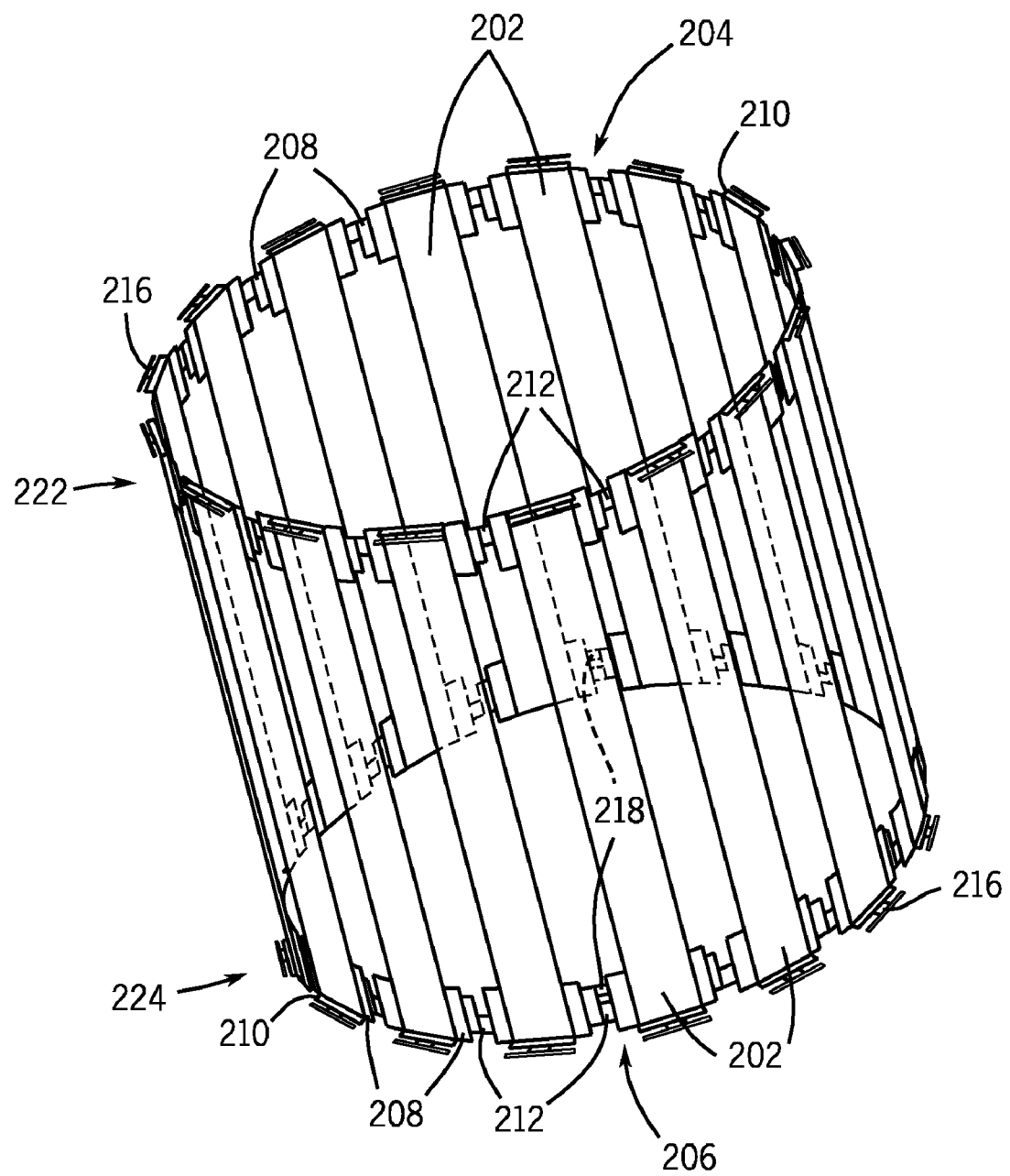
FIG. 3 is a simplified perspective view of the RF coil of FIG. 2 in accordance with an embodiment.
Figure 4:
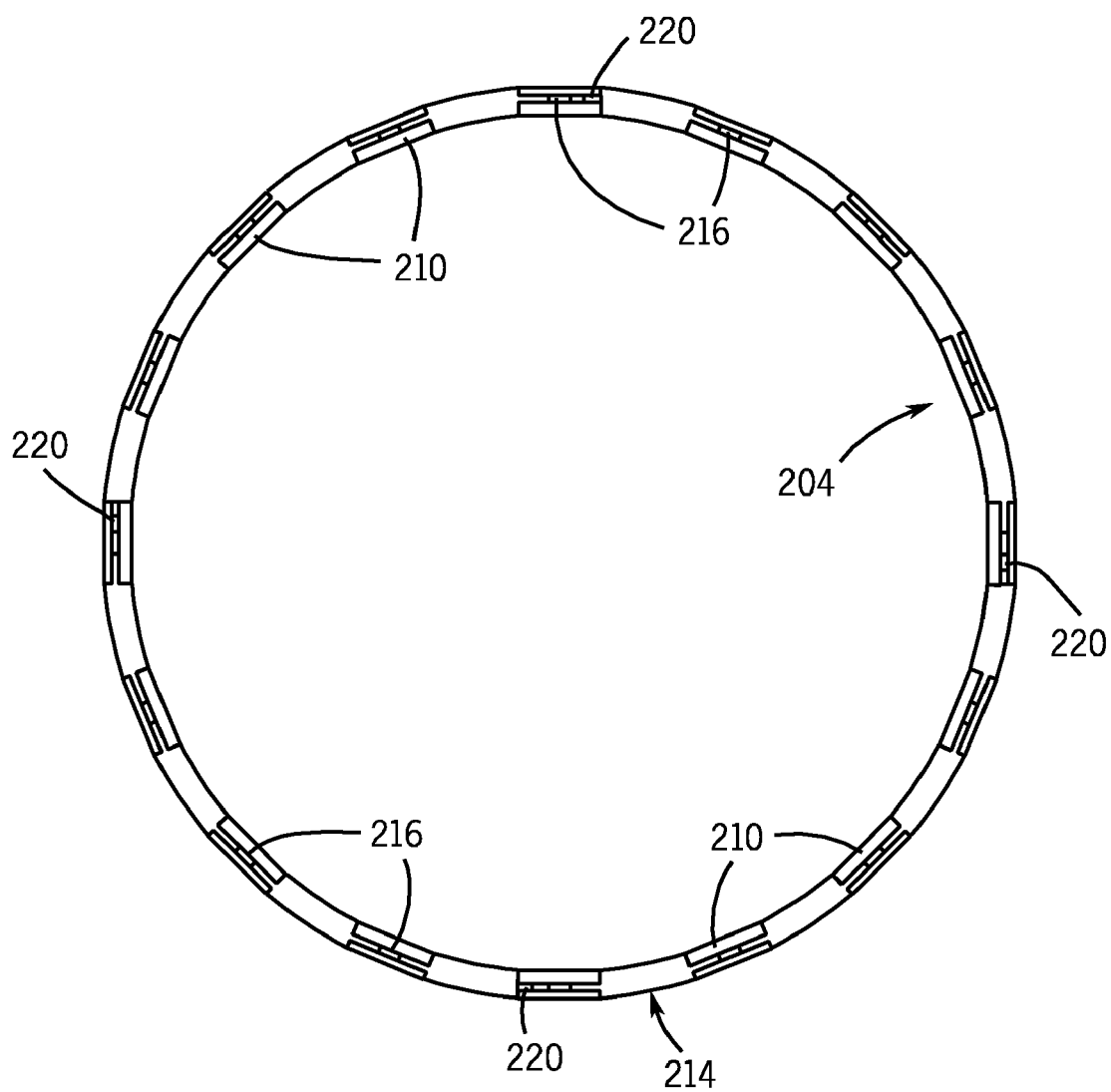
FIG. 4 is a top or end view of the RF coil of FIG. 2 in accordance with an embodiment.

As mentioned, RF coils (for example, RF body coil 56 and a surface coil or coils 76 (e.g., an array of surface coils)) may be used to transmit RF excitation pulses and/or to receive MR signals. For multi-nuclear imaging applications, a multi-tuned RF coil can be used. The following description is in reference to FIGS. 2-4. FIG. 2 is a perspective view of a multi-tuned hybrid radio frequency (RF) coil in accordance with an embodiment. FIG. 3 is a simplified perspective view of the RF coil of FIG. 2 in accordance with an embodiment. In FIG. 3, the RF shield 214 is not shown for clarity. FIG. 4 is a top or end view of the RF coil of FIG. 2 in accordance with an embodiment.

Referring to FIGS. 2-4, RF coil 200 is a hybrid birdcage and transverse electromagnetic (TEM) coil configuration that can be tuned to multiple resonant frequencies for imaging multiple nuclei. RF coil 200 is configured to provide both a birdcage mode and a TEM mode simultaneously using a single set of rungs. The configuration of RF coil 200 provides improved B1 field homogeneity, signal to noise ration (SNR) and uniformity for multi-nuclear imaging applications. RF coil 200 is cylindrical and annular in shape and is compatible with the above-described MRI system of FIG. 1 and any other similar or equivalent system for obtaining MR images. The RF coil 200 configuration shown in FIG. 2 may be used for a whole-body RF coil or for a surface (or local) coil such as a head coil. For a whole-body RF coil, the dimensions of the RF coil 200 are configured so that the RF coil can be mounted inside a gradient coil assembly 50 (shown in FIG. 1) in a spaced apart coaxial relationship. For a surface coil (e.g., a head coil), the dimensions of the RF coil 200 are configured so that the RF coil can be disposed within the patient imaging space 72 (shown in FIG. 1).

RF coil 200 includes, among other elements, a plurality of rungs (or legs, conductor elements) 202, a first end ring 204, a second end ring 206 and an RF shield 214. An exemplary number of rungs 202 are shown in FIG. 2. Fewer or more rungs may be used based on the requirements of a particular imaging application, for example, based on the field of view (FOV), imaging resolution, power requirements and imaging speed. The rungs 202 are arranged cylindrically and can be, for example, uniformly spaced from one another. The first end ring 204 is located at a first end 222 of the plurality of rungs 202. The second end ring 206 is located at a second end 224 of the plurality of rungs 202. The first end ring 204 and the second end ring 206 oppose one another in a spaced-apart relationship. Rungs 202 and end rings 204, 206 are constructed from conventional materials with high electrical conductivity such as copper. In various embodiments, the rungs 202 can be constructed from a copper foil conductor or a round conductor.

The first end ring 204 and the second end ring 206 each include a plurality of tuning capacitors 208 (e.g., low inductance end ring capacitors) that are located between the rungs 202 and are used to electrically connect the rungs 202 to one another. The tuning capacitors 208 are used for tuning a birdcage mode of the RF coil 200. Each birdcage mode tuning capacitor 208 is connected in series with an RF trap 212, for example, an LC trap. The LC trap may be, for example, a parallel LC trap. RF traps 212 are configured to provide isolation from the other resonant frequencies of the RF coil 200. RF coil 200 also includes a plurality of tuning capacitors 210 for tuning a TEM mode of the RF coil 200. A TEM mode tuning capacitor 210 is connected to each end 222, 224 of each rung 202 in the RF coil 200 and is used to electrically connect the rungs 202 to the RF shield 214. Each TEM mode tuning capacitor 210 is connected in series with an RF trap 216, for example, an LC trap that is in turn connected to the RF shield 214. The LC trap may be, for example, a parallel LC trap. RF traps 216 are configured to provide isolation from the other resonant frequencies of the RF coil 200. The RF shield 214 is cylindrical in shape and is disposed around the plurality of rungs 202 and the end rings 204, 206. As mentioned, the RF shield is coupled to tan RF trap 216 and a TEM mode tuning capacitor 210 at each end 222, 224 of each ring 224. Accordingly, the RF shield 214 is coupled to each rung 202 at both ends 222, 224 of the rung. RF shield 214 is constructed from conventional materials. Ports, for example, ports 218 (shown in FIGS. 2 and 3) and ports 220 (shown in FIG. 4) are provided to transmit and receive signals at the appropriate resonance frequency or frequencies.

As mentioned above, RF coil 200 can be tuned to multiple resonant frequencies for imaging multiple nuclei (for example, nuclei such as $^1$H, $^{31}$P, $^{13}$C, $^{19}$F, $^2$H, $^{29}$Si, $^{27}$Al and $^{27}$N). In one embodiment, during operation the birdcage mode is tuned to a first resonant frequency for imaging a first nuclei (e.g., $^1$H (proton)) and the TEM mode is tuned to a second resonance frequency for imaging a second nuclei (e.g., $^{13}$C). The birdcage mode tuning capacitors 208 are tuned to the first resonant frequency. Each LC trap 212 is used to provide isolation from the resonant frequency of the TEM mode and to prevent the signals from each mode from mixing during operation of the RF coil 200. Ports 218 are used to send and receive signals at the first resonant frequency. The TEM mode tuning capacitors 210 are tuned to the second resonant frequency. Each LC trap 216 is used to provide isolation from the resonant frequency of the birdcage mode and to prevent the signals from each mode from mixing during operation of the RF coil 200. Ports 220 are used to send and receive signals at the second resonant frequency.

In other embodiments, RF coil 200 can be tuned to more than two resonant frequencies, for example, three or four resonant frequencies. To operate at more than two frequencies, either one or both of the birdcage mode or the TEM mode can be tuned to more than one frequency according to known methods. For example, the birdcage mode can be operated in quadrature and tuned to two frequencies. Four ports 218 (two ports are shown in FIG. 3) are provided at 90 degree intervals to one another. Two ports are used to send/receive signals at a first frequency and two ports are used to send/receive signals at a second frequency. The TEM mode can also be operated in quadrapole and tuned to two frequencies. Four ports 220 (shown in FIG. 4) are provided at 90 degree intervals to one another. Two ports are used to send/receive signals at a first frequency and two ports are used to send/receive signals at a second frequency. Accordingly, in this embodiment, up to four nuclei can be imaged at the same time.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

What is claimed is:

1. A radio frequency (RF) coil for a magnetic resonance imaging system, the RF coil comprising:
 a plurality of rungs disposed around a volume;
 a first end ring connected to a first end of the plurality of rungs, the first end ring comprising a first plurality of birdcage mode tuning capacitors and a first plurality of passive RF traps, each passive RF trap in the first plurality of passive RF traps being connected in series with a respective birdcage mode tuning capacitor in the first plurality of birdcage mode tuning capacitors;
 a second end ring connected to a second end of the plurality of rungs, the second end ring comprising a second plurality of birdcage mode tuning capacitors and a second plurality of passive RF traps, each passive RF trap in the second plurality of passive RF trap being connected in series with a respective birdcage mode tuning capacitor in the second plurality of birdcage mode turning capacitors;
 an RF shield disposed around the plurality of rungs, the first end ring and the second end ring;
 a plurality of transverse electromagnetic (TEM) mode tuning capacitors each TEM mode tuning capacitor coupled to one of the plurality of rungs; and
 a third plurality of RF traps, each RF trap in the third plurality of RF traps coupled to one of the plurality of TEM mode tuning capacitors and the RF shield.

2. An RF coil according to claim 1, wherein the RF coil is a whole-body RF coil.

3. An RF coil according to claim 1, wherein the RF coil is a head coil.

4. An RF coil according to claim 1, wherein a birdcage mode tuning capacitor and an RF trap are disposed between each of the plurality of rungs.

5. An RF coil according to claim 4, wherein the RF trap is a parallel LC trap.

6. An RF coil according to claim 1, wherein each of the plurality of TEM mode tuning capacitors is connected in series with one of the RF traps in the third plurality of RF traps.

7. An RF coil according to claim 6, wherein the third plurality of RF traps are parallel LC traps.

8. An RF coil according to claim 1, wherein the first plurality of birdcage mode tuning capacitors and the second plurality of birdcage mode tuning capacitors are tuned to a first resonant frequency and the plurality of TEM mode tuning capacitors are tuned to a second resonant frequency.

9. An RF coil according to claim 1, wherein the plurality of rungs are composed of copper foil conductors.

10. An RF coil according to claim 1, wherein the plurality of rungs are composed of round conductors.

11. An RF coil according to claim 1, wherein each rung in the plurality of rungs has a first end and a second end and the first end is coupled to a TEM mode tuning capacitor and the second end is coupled to a TEM mode tuning capacitor.

12. An RF coil according to claim 11, wherein the first end is electrically connected to the RF shield and the second end is electrically connected to the RF shield.

13. An RF coil according to claim 1, wherein the RF coil is configured to operate in a birdcage mode and a TEM mode.

14. An RF coil according to claim 1, wherein the RF coil is configured to operate at multiple frequencies in a birdcage mode and a TEM mode.

15. An RF coil according to claim 1, wherein the RF coil is configured to form a birdcage coil and a TEM coil, the birdcage coil having the same diameter as the TEM coil.

16. A resonance assembly for a magnetic resonance imaging system, the resonance assembly comprising:
  a superconducting magnet;
  a gradient coil assembly disposed within an inner diameter of the superconducting magnet;
  a radio frequency (RF) coil disposed within an inner diameter of the gradient coil assembly and comprising:
    a first end ring comprising a first plurality of RF mode tuning capacitors tuned to a first resonant frequency;
    a second end ring comprising, a second plurality of RF mode tuning capacitors tuned to the first resonant frequency;
    a plurality of rungs disposed between and connected to the first end ring and the second end ring;
    a plurality of TEM mode tuning capacitors coupled to the plurality of rungs and tuned to a second resonant frequency; and
    an RF shield disposed around the first end ring, the second end ring, the plurality of rungs and the plurality of TEM mode tuning capacitors, the RF shield coupled to the plurality of TEM mode tuning capacitors.

17. A resonance assembly according to claim 16, wherein the RF coil is a whole-body RF coil.

18. A resonance assembly according to claim 16, wherein the RF coil is a surface coil.

19. A resonance assembly according to claim 16, wherein the first end ring further comprises a first plurality of RF traps coupled to the first plurality of RF mode tuning capacitors and the second end ring further comprises a second plurality of RF traps coupled to the second plurality of RF mode tuning capacitors.

20. A resonance assembly according to claim 19, further comprising a plurality of TEM RF traps coupled to the plurality of TEM mode tuning capacitors.

21. A resonance assembly according to claim 16, wherein the first end ring, the second end ring and the plurality of rungs are associated with a birdcage mode.

22. A resonance assembly according to claim 16, wherein the plurality of rungs, the plurality of TEM mode tuning capacitors and the RF shield are associated with a transverse electromagnetic (TEM) mode.

* * * * *